(12) United States Patent
Wu

(10) Patent No.: US 8,245,117 B1
(45) Date of Patent: Aug. 14, 2012

(54) LOW COMPLEXITY CHIEN SEARCH IN CHASE-TYPE DECODING OF REED-SOLOMON CODES

(75) Inventor: Yingquan Wu, Santa Clara, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 408 days.

(21) Appl. No.: 12/653,033

(22) Filed: Dec. 7, 2009

Related U.S. Application Data

(60) Provisional application No. 61/203,587, filed on Dec. 23, 2008.

(51) Int. Cl.
*H03M 13/00* (2006.01)

(52) U.S. Cl. .................................................. 714/781

(58) Field of Classification Search .................. 714/781, 714/784
See application file for complete search history.

(56) References Cited

U.S. PATENT DOCUMENTS

| | | | | |
|---|---|---|---|---|
| 4,162,480 A * | 7/1979 | Berlekamp | ................... | 714/784 |
| 5,974,580 A * | 10/1999 | Zook et al. | ................... | 714/755 |
| 6,131,178 A * | 10/2000 | Fujita et al. | ................... | 714/784 |
| 7,328,395 B1 * | 2/2008 | Burd | ................... | 714/780 |
| 7,590,923 B1 * | 9/2009 | Kikuchi et al. | ................... | 714/780 |
| 7,689,893 B1 * | 3/2010 | Burd | ................... | 714/784 |
| 7,793,195 B1 | 9/2010 | Wu | | |
| 8,060,809 B2 * | 11/2011 | Hsu | ................... | 714/784 |
| 2002/0023246 A1 * | 2/2002 | Jin | ................... | 714/755 |
| 2006/0174181 A1 * | 8/2006 | Banks et al. | ................... | 714/784 |
| 2008/0104489 A1 * | 5/2008 | Ito | ................... | 714/794 |
| 2009/0083608 A1 * | 3/2009 | Au et al. | ................... | 714/784 |
| 2009/0254796 A1 * | 10/2009 | Hassner et al. | ................... | 714/780 |
| 2010/0199149 A1 * | 8/2010 | Weingarten et al. | ................... | 714/773 |

OTHER PUBLICATIONS

"Reed Solomon Codes," Elektrobit, Joel Sylvester, Jan. 2011, http://www.csupomona.edu/~jskang/files/rs1.pd.*
D. Chase, "A class of algorithms for decoding block codes with channel measurement information," IEEE Transactions on Information Theory, vol. 18, pp. 170-182, Jan. 1972.
Tang et al., "On Combining Chase-2 and GMD Decoding Algorithms for Nonbinary Block Codes," IEEE Communications Letters, vol. K, No. 5, May 2001.
G. David Forney, Jr., "Generalized Minimum Distance Decoding," IEEE Transactions on Information Theory, vol. 12, No. 2, Apr. 1966.
Ralf Kotter, "Fast Generalized Minimum-Distance Decoding of Algebraic-Geometry and Reed-Solomon Codes," IEEE Transactions on Information Theory, vol. 42, No. 3, May 1996.

* cited by examiner

*Primary Examiner* — Scott Baderman
*Assistant Examiner* — Neil Miles
(74) *Attorney, Agent, or Firm* — Van Pelt, Yi & James LLP

(57) ABSTRACT

Data is processed by obtaining a length of an error locator polynomial. It is determined whether the length of the error locator polynomial is greater than a threshold. In the event the length of the error locator polynomial is greater than the threshold, performance of a Chien search on the error locator polynomial is skipped. In the event the length of the error locator polynomial is less than or equal to than the threshold, the Chien search is performed on the error locator polynomial to determine one or more roots of the error locator polynomial, where the roots correspond to one or more error locations.

20 Claims, 8 Drawing Sheets

LOW COMPLEXITY CHIEN SEARCH IN CHASE-TYPE DECODING OF REED-SOLOMON CODES

CROSS REFERENCE TO OTHER APPLICATIONS

This application claims priority to U.S. Provisional Patent Application No. 61/203,587 entitled LOW COMPLEXITY CHIEN SEARCH IN CHASE-TYPE DECODING OF REED-SOLOMON CODES filed Dec. 23, 2008 which is incorporated herein by reference for all purposes.

BACKGROUND OF THE INVENTION

Reed-Solomon codes are commonly used error correction codes. Some example applications include magnetic and optical data storage, wireline and wireless communications, and satellite communications. A Reed-Solomon code (n, k) over a finite field GF(q) satisfies n<q and achieves the maximally separable distance, i.e., d=n−k+1.

Chase-type decoders are a group or type of decoders of Reed-Solomon encoded data. In general, a Chase decoder flips and/or erases one or more (e.g., hard) bits prior to performing a Chien search. A Chien search (in general) locates the roots of a polynomial and when applied to an error locator polynomial is used to determine error locations since the roots of an error locator polynomial correspond to error locations. In some cases, an error locator polynomial passed to a Chien search may be incorrect (e.g., because the errors exceeded the error correction capability of a code). By flipping and/or erasing one or more bits prior to the Chien search, the correct error locator polynomial may be generated and passed to the Chien search. It would be desirable to develop new Chase-type decoders that are faster than existing Chase-type decoders.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
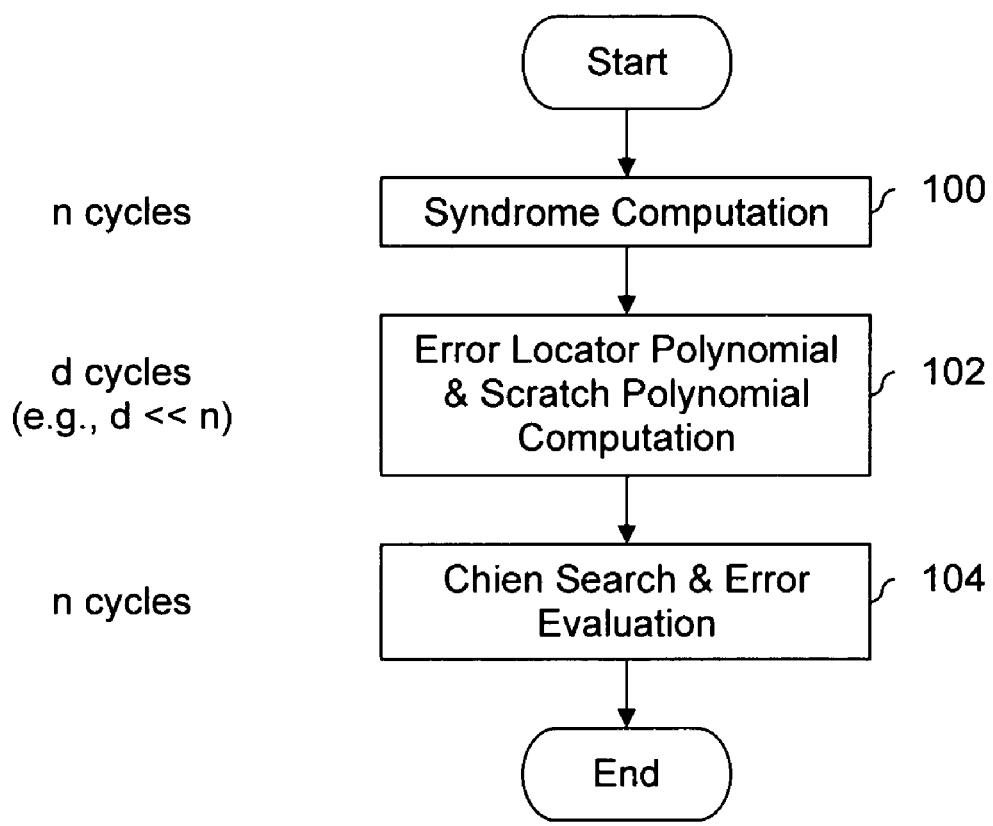
FIG. 1 is a diagram showing an example of the Berlekamp-Massey algorithm.

FIG. 1 is a diagram showing an example of the Berlekamp-Massey algorithm. The Berlekamp-Massey algorithm efficiently decodes up to half minimum distance with hardware complexity O(dn) where d is the distance of the Reed-Solomon code and n is the length of the codeword for an RS(n,k) code. During the first stage at 100, syndrome computation is performed, which takes n cycles. The second stage (step 102) computes an error locator polynomial and (at least in some embodiments) a scratch polynomial, which takes d cycles (the practical code rate is greater than 0.8, rendering the minimum distance d much smaller than the code length n). The third stage performs a Chien search and error evaluation at 104, which takes n cycles. During step 104, the roots of the error locator polynomial are located, where the roots correspond to locations of errors.

Note in the scenario of Chase-type decoding (the same holds true for GMD decoding), the syndrome update from preceding syndromes can be implemented in d−1 cycles, under parallel operation of O(d) hardware, and the Belekamp-Massey algortlm (or the extended Euclidean algorithm) is again finished in d−1 cycles, under parallel operation of O(d) hardware. On the other hand, the implementation of Chien search takes n cycles with O(d) hardwares. Hence, the Chien search dominates the computational time of the Chase-type decoding for practical high-rate Reed-Solomon codes.

During Chase-type decoding, one or more symbols or bits in an error locator polynomial are flipped or erased (e.g., between steps 102 and 104). The following figure shows some examples of flipping and erasing.

Figure 2:
FIG. 2 is a diagram showing an example of flipping and erasing.

FIG. 2 is a diagram showing an example of flipping and erasing. In the example shown, raw data 200 is a four bits long, hard value having the value 0110. In flipped data 202, the least significant bit has been flipped from a 0 to a 1 so that flipped data 202 is 0111. In erased data 203, the most significant bits has been erased from a 0 to an X (indicating an erasure) so that erased data 204 is X110. The erasure and flipping shown herein are merely exemplary and in various other embodiments any number of bits and/or any bits in any location are flipping or erased.

Figure 3:
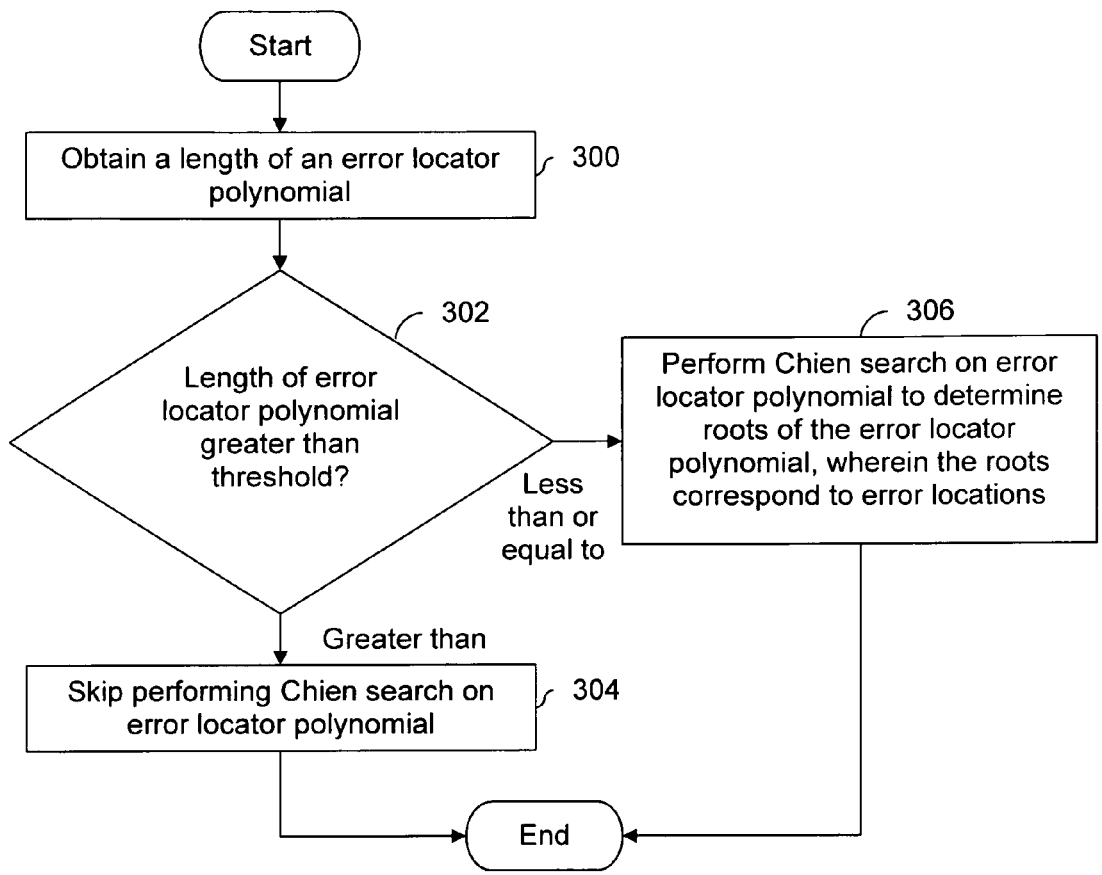
FIG. 3 is a flowchart illustrating an embodiment of a process in which a Chien search is skipped under certain conditions.

FIG. 3 is a flowchart illustrating an embodiment of a process in which a Chien search is skipped under certain conditions. In some embodiments, the example process shown is performed between steps 102 (computation of error locator polynomial and scratch polynomial) and 104 (Chien search and error evaluation) in FIG. 1.

At 300, a length of an error locator polynomial is obtained. As used herein, the length of a polynomial refers in general to the number of coefficients or elements in a polynomial. For example, the polynomial $\alpha_2 \cdot x^2 + \alpha_1 \cdot x + \alpha_0$ has a length of 3.

It is determined at 302 whether the length of the error locator polynomial is greater than a threshold. In some embodiments, the threshold is equal to $\tau$ where the symbol $\tau$ represents the error correction capability. In some embodiments, the threshold is equal to $\tau + f/2$ where f represents the erasure correction capability. If the length of the error locator polynomial is greater than the threshold, the process skips performing Chien search on the error locator polynomial at 304. If the length of the error locator polynomial is less than or equal to the threshold, a Chien search is performed on the error locator polynomial to determine roots of the error locator polynomial, wherein the roots correspond to error locations at 306.

The following discussion provides insights into the example process described above.

Lemma 1 Given syndromes $S_j$ for j=1, 2, . . . , d−1, let $(\Lambda^{(2\tau)}(x), L_{2\tau})$ be a minimum-length linear recursion with $L_{2\tau} \leq \tau$ and $2\tau < d-1$, that will produce $S_j$ for j=1, 2, . . . , 2$\tau$. Suppose that $$\sum_{j=0}^{n-1} \Lambda_j^{(2\tau)} S_{k-j} = 0, \quad k = 2\tau + 1, 2\tau + 2, \ldots, d-1$$

Then, either $\Lambda^{(2\tau)}(x)$ is the correct error-locator polynomial or more than d−1−$\tau$ errors have occurred.

The above lemma leads to the following proposition,

Proposition 1 Given syndromes $S_j$ for j=1, 2, . . . , d−1, let $(\Lambda^{(2\tau)}(x), L_{2\tau})$ be a minimum-length linear recursion with $L_{2\tau} \leq \tau$ that will produce $S_j$ for j=1, 2, . . . , 2$\tau$. Suppose that $$\sum_{j=0}^{n-1} \Lambda_j^{(2\tau)} S_{k-j} \neq 0$$

for at least one case among k=2$\tau$+1, 2$\tau$+2, . . . , d−1. Then, $\Lambda^{(2\tau)}(x)$ cannot be a valid error-locator polynomial of up to $\tau$ errors.

Note that the procedure of the above proposition takes only 2$\tau$ of Berlekamp-Massey linear recursion iterations, while the remaining d−1−2$\tau$ steps compute the discrepancies $$\sum_{j=0}^{n-1} \lambda_j^{2\tau} S_{k-j},$$

if one of them is nonzero, then the current candidate $(\Lambda^{(2\tau)}(x), L_{2\tau})$ is discarded without going through the Chien search.

Proposition 2 Given syndromes $S_j$ for j=1, 2, . . . , d−1, let $(\Lambda^{(d-1)}(x), L_{d-1})$ be a minimum-length linear recursion with $L_{d-1} > \tau$ that will produce $S_j$ for j=1, 2, . . . , d−1. Then, $\Lambda^{(d-1)}(x)$ cannot be a valid correct error-locator polynomial of up to $\tau$ errors.

The proof is shown following the condition $L_{d-1} > \tau$. The valid candidates associated with the Proposition 1 is only a subset of the valid ones of Proposition 2, due to the following lemma:

Lemma 2 Given syndromes $S_j$ for j=1, 2, . . . , d−1, let $(\Lambda^{(2\tau)}(x), L_{2\tau})$ be a minimum-length linear recursion with $L_{2\tau} \leq \tau$ that will produce $S_j$ for j=1, 2, . . . , 2$\tau$. Suppose that $$\sum_{j=0}^{n-1} \Lambda_j^{(2\tau)} S_{k-j} = 0$$

for k=2$\tau$+1, 2$\tau$+2, . . . , d−1. Then, the length associated with d−1 recursions $L_{d-1} \leq \tau$.

It follows from the discrepancies of the recursions j=2$\tau$+1, . . . , d−1 are zeros, consequently, $\Lambda^{(j)}(x) = \Lambda^{(2\tau)}(x)$, j=2$\tau$+1, . . . , d−1.

The following lemma sheds light on the probability of false-alarm.

Lemma 3 Given syndromes $S_j$ for j=1, 2, . . . , d−1, let $(\Lambda^{(d-1)}(x), L_{d-1})$ be a minimum-length linear recursion with $L_{d-1} \leq \tau$ that will produce $S_j$ for j=1, 2, . . . , d−1. Then, there are at least d−1−2$\tau$ consecutive zero discrepancies (among d−1 ones).

Note that the length of the correction polynomial (sometimes referred to as the scratch polynomial) $B^{(d-1)}(x)$ is at least d−1−$\tau$, which is the consequence of d−1−2$\tau$ consecutive zero discrepancies.

If discrepancy is treated as a random variable in GF(q) given that there are more than $\tau$ errors, then, the probability $L_{d-1} \leq \tau$ is approximately $q^{(d-1-2\tau)}$, i.e., an invalid candidate error-locator polynomial is passed to the Chien search procedure is roughly with a probability of $q^{-(d-1-2\tau)}$.

The following proposition extends to erasure decoding.

Proposition 3 Given syndromes $S_j$ for j=1, 2, . . . , d−1, let $(\Lambda^{(d-1)}(x) L_{d-1})$ be a minimum-length linear recursion with $$L_{d-1} > \tau + \frac{f}{2}$$

that will produce $S_j$ for j=1, 2, . . . , d−1, where f denotes the number of erasures. Then, $\Lambda^{(d-1)}(x)$ is not a valid error-locator polynomial of up to $$\tau + \frac{f}{2}$$

errors.

In various embodiments, the example process shown in FIG. 3 is repeated and/or supplemented in a variety of ways. The following flowcharts show some examples.

Figure 4:
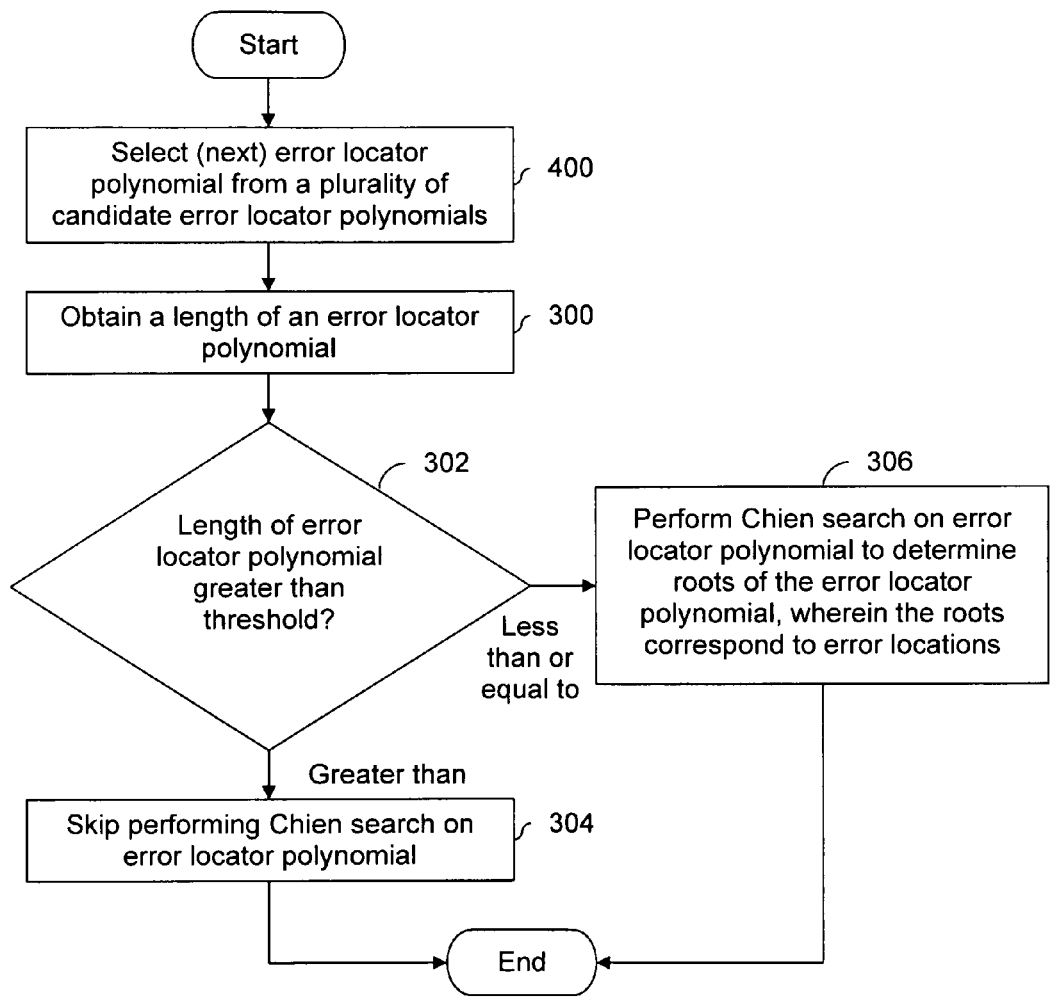
FIG. 4 is a flowchart illustrating an embodiment of a process where an error locator polynomial is selected from a plurality of candidate error locator polynomials.

FIG. 4 is a flowchart illustrating an embodiment of a process where an error locator polynomial is selected from a plurality of candidate error locator polynomials. In the example shown, some of the steps in FIG. 4 are similar to steps in FIG. 3 and are indicated by the same reference number.

At 400, a (next) error locator polynomial is selected from a plurality of candidate error locator polynomials. The selected polynomial is then processed at step 300. In some embodiments, the candidate error locator polynomials are arranged in a list (e.g., in arbitrary order) and are "pulled" from the list in that order. In some embodiments, each candidate error locator polynomial has one or more reliabilities (sometimes referred to as a probability or likelihood) associated with it and selection is based on the reliabilities. An example is described in further detail below. In some such embodiments, the reliabilities are output by a soft-output Viterbi decoder.

Figure 5:
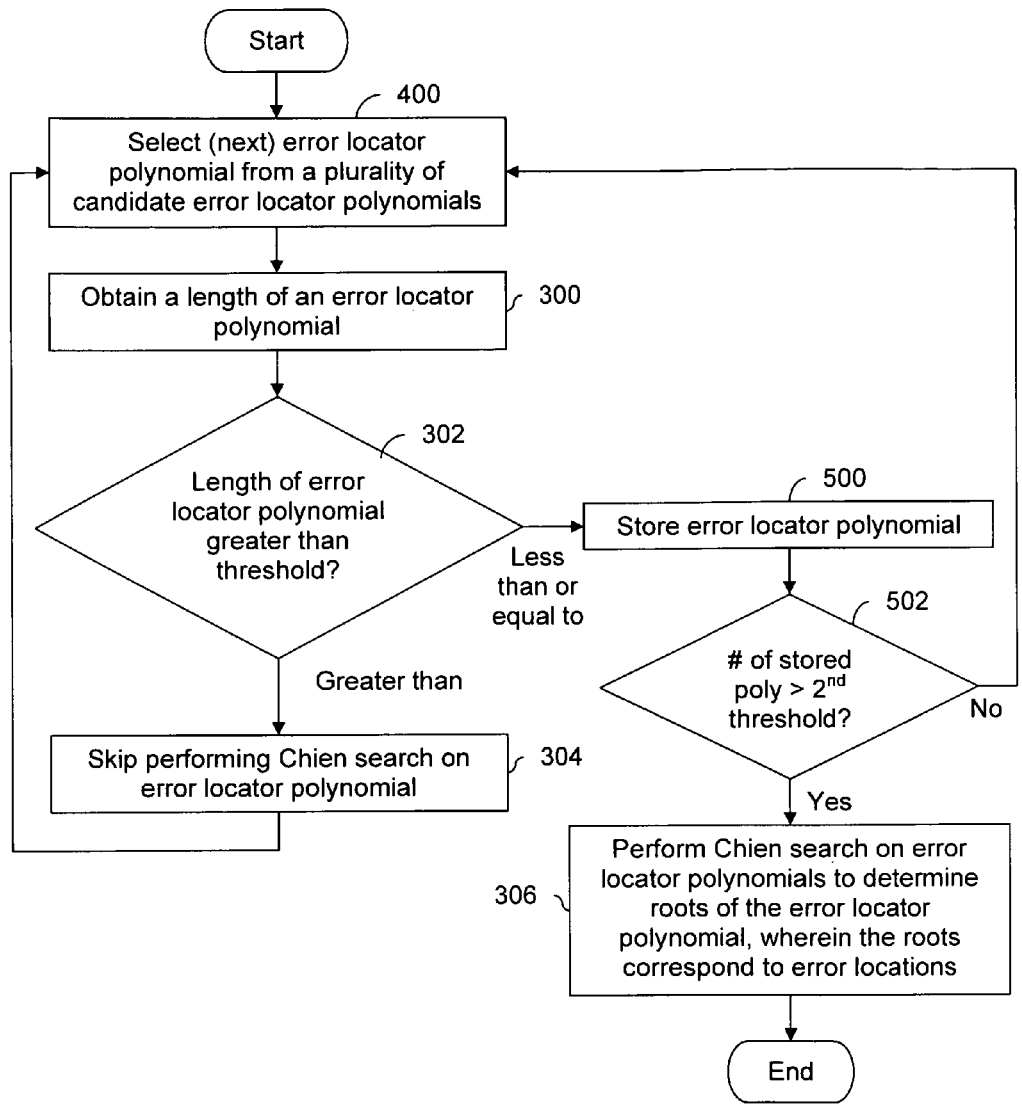
FIG. 5 is a flowchart illustrating an embodiment of a process where a Chien search is performed on a plurality of error locator polynomials.

FIG. 5 is a flowchart illustrating an embodiment of a process where a Chien search is performed on a plurality of error locator polynomials. As before, some of the steps in FIG. 5 are similar to steps in FIGS. 3 and 4.

In the example shown, after skipping performance of a Chien search at 304 in the event the length of an error locator polynomial is greater than a threshold, the process selects a next error locator polynomial from a plurality of candidate error locator polynomials at 400.

If at 302 it is determined that the length of the error locator polynomial is less than or equal to a threshold at 302, at 500 the error locator polynomial is stored. It is then determined at 502 if the number of stored polynomials is greater than a second threshold. For example, some systems or processes may be configured to determine or identify two error locator polynomials which have a length less than or equal to a threshold and perform a Chien search on those two error locator polynomials.

If the number of stored polynomials is not greater than the second threshold, a next error locator polynomial is selected at 400. Otherwise, if the number of stored polynomials is greater than the second threshold, a Chien search is performed on the error locator polynomials to determine the roots of the error locator polynomial at 306. The process shown herein in merely exemplary and may be modified. For example, a Chien search may take a relatively long time and in some embodiments performing a Chien search at 306 begins as soon as an appropriate error locator polynomial is found (i.e., in some embodiments a process does not necessarily wait for all error locator polynomials to be located before beginning a Chien search).

Figure 6:
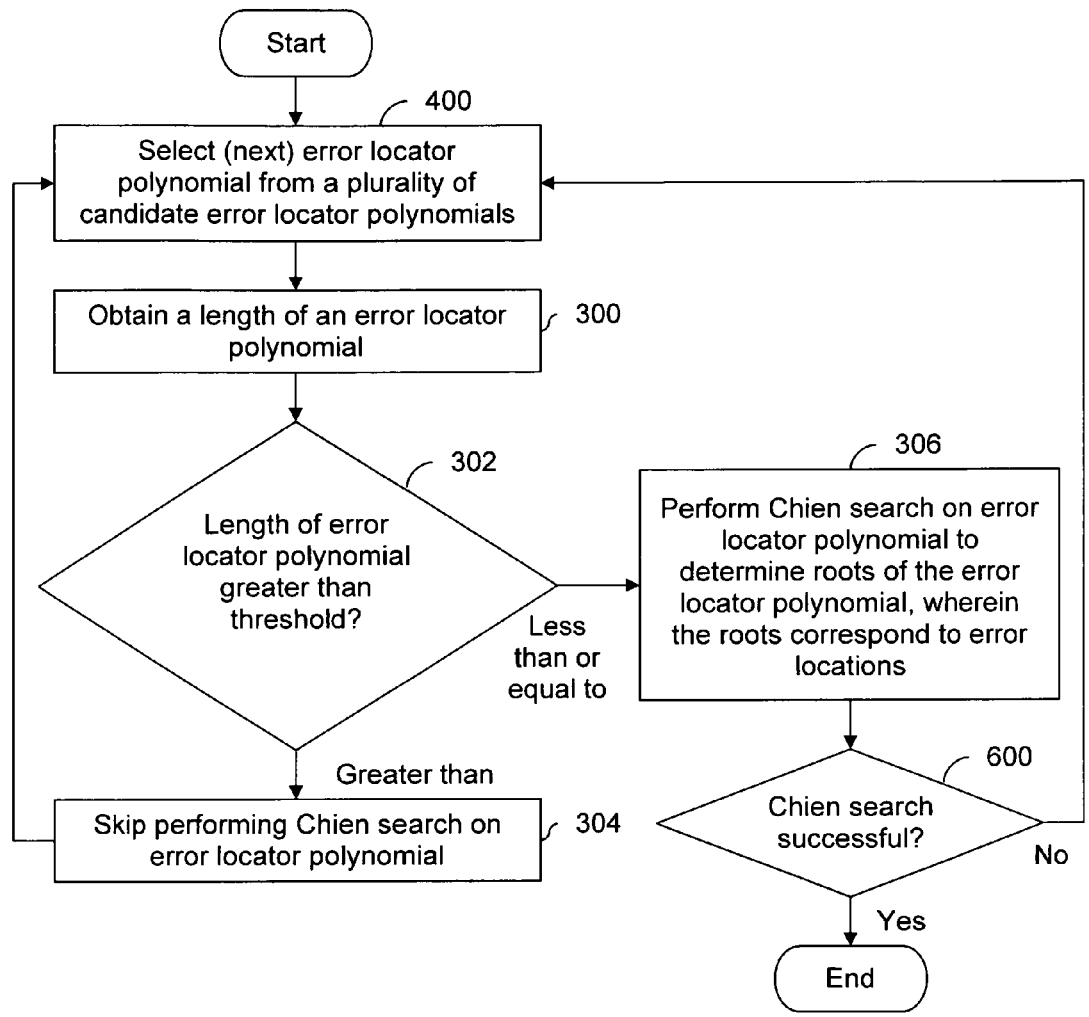
FIG. 6 is a flowchart illustrating an embodiment of a process where a Chien search is performed on a plurality of error locator polynomials.

FIG. 6 is a flowchart illustrating an embodiment of a process where a Chien search is performed on a plurality of error locator polynomials. In the example shown, some of the steps in FIG. 6 are similar to steps in FIGS. 3 and 4.

After performing a Chien search at 306, it is determined whether the Chien search was successful at 600. If the Chien search was not successful, a next error locator polynomial is selected at 400.

As described above, in some embodiments, selection of a (next) error locator polynomial from a plurality of candidates is based on one or more reliabilities (e.g., output by a soft-output Viterbi decoder). The following figures show some examples.

Figure 7:
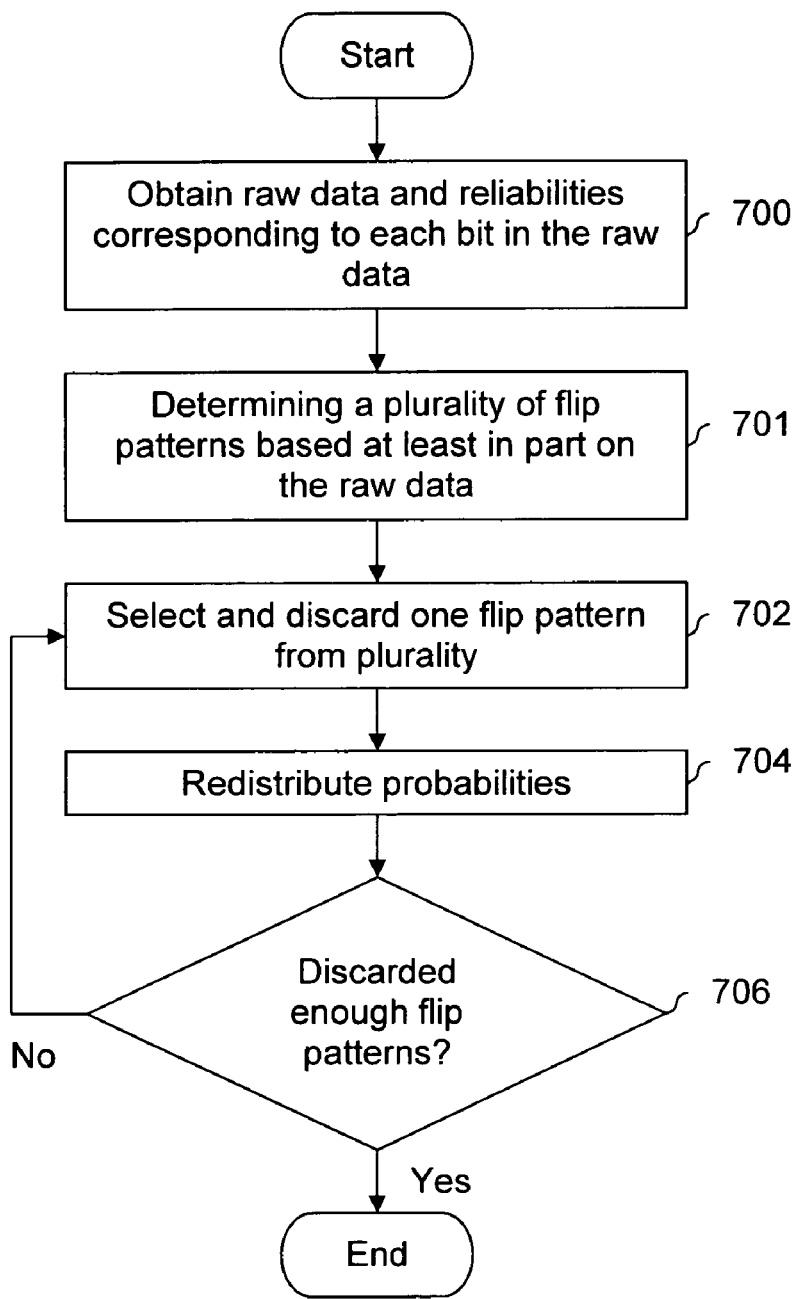
FIG. 7 is a flowchart illustrating an embodiment of a process for selecting an error locator polynomial from a plurality of candidates based at least in part on reliabilities.

FIG. 7 is a flowchart illustrating an embodiment of a process for selecting an error locator polynomial from a plurality of candidates based at least in part on reliabilities. In some embodiments, the process is used in step 400 in the above figures to select one of a plurality of candidates. In some embodiments, the process is halted when n candidates remain and the process is used to find n candidates (e.g., to obtain a plurality of n candidates at step 400 in FIG. 4 from which one is selected using this technique or some other technique).

At 700, raw data and reliabilities corresponding to each bit in the raw data are obtained. In some embodiments, the raw data corresponds to a hard-output received dataword.

Figure 8:
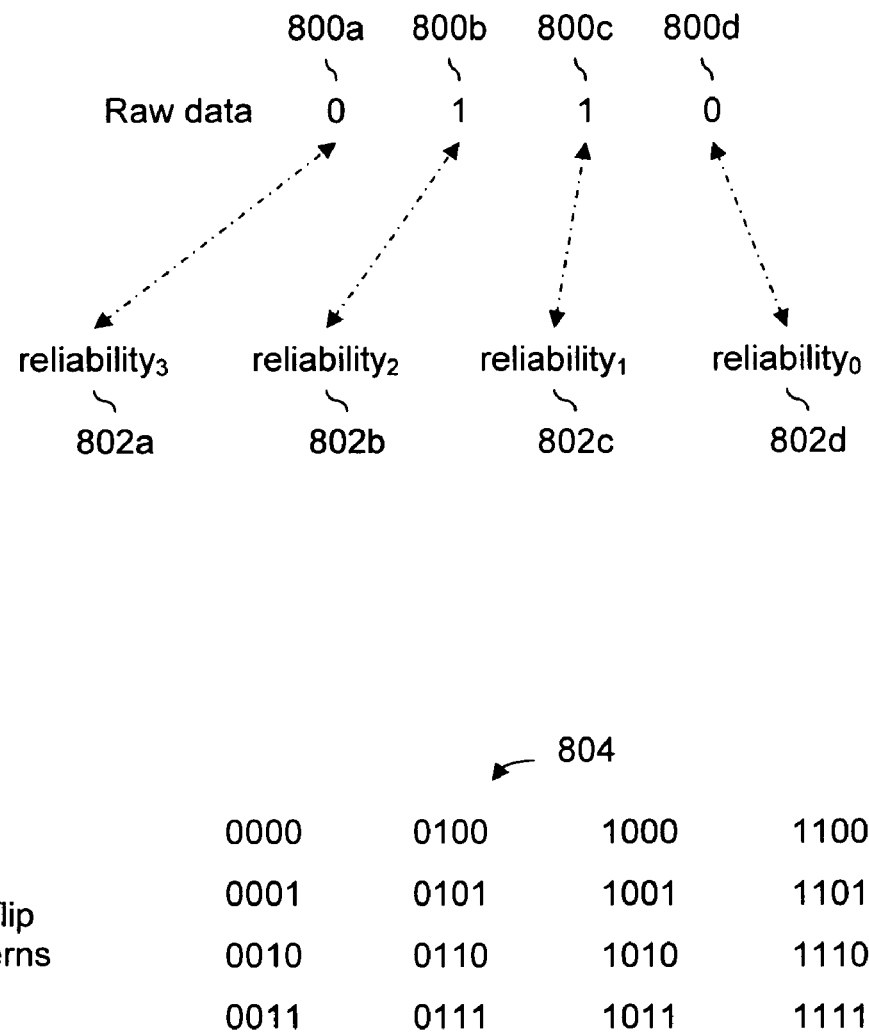
FIG. 8 is a diagram showing an embodiment of raw data and associated reliabilities.

FIG. 8 is a diagram showing an embodiment of raw data and associated reliabilities. In the example shown, the raw data has 4 bits and has a (hard) value of 0110. The most significant bit (800a) has a reliability value of $reliability_3$ (802a), the second most significant bit (800b) corresponds to a reliability value of $reliability_2$ (802b), and so on. Each of the reliabilities in this example range from 0 to 1. In some embodiments, the raw data 800 and reliabilities 802 are output by a soft-output Viterbi decoder or some other detector.

A plurality of flip patterns is determined based at least in part on the raw data at 701. In 804 in FIG. 8, one example is shown where all possible flip patterns are shown. One flip pattern is selected and discarded from a group at 702. In some embodiments, a process begins with all possible flip or erasure candidates. In FIG. 8 (for example) diagram 804 shows all possible flip combinations for raw data 800, including the original raw data 800 (i.e., 0110). In some embodiments, an initial probability for a particular combination (e.g., a particular 4-bit combination) is a product of reliabilities (e.g., the product of $reliability_3$, $reliability_2$, $reliability_1$, and $reliability_0$). In some embodiments, each possible combination shown in 804 has a probability associated with that particular combination and the one discarded at 702 is the one with the lowest probability.

At 704 in FIG. 7, the probabilities are redistributed. Diagram 806 in FIG. 8 shows one example. In some embodiments, this is performed by equally dividing and reallocating the probabilities associated with all of the discarded patterns to their nearest remaining or surviving patterns (in the Hamming distance sense).

In some embodiments, after discarding and redistributing probabilities as described above, the resulting probabilities are normalized so that all of them (including any which did not receive or participate in the redistribution of probabilities) sum to 1.

It is determined if enough flip patterns have been discarded at 706. If not, one flip pattern is selected and discarded from the group at 702. In some embodiments, a single candidate is desired and the process repeats until only one flip combination remains. In some other embodiments, two or more flip patterns are desired (e.g., to obtain the plurality of candidate error locator polynomials from which a selection is made at 400 in the above figures).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for processing data, comprising:
    obtaining a length of an error locator polynomial;
    determining, using a processor in a data decoder, whether the length of the error locator polynomial is greater than a first threshold;
    in the event the length of the error locator polynomial is greater than the first threshold, skipping performance of a Chien search on the error locator polynomial;
    in the event the length of the error locator polynomial is less than or equal to than the first threshold, performing the Chien search on the error locator polynomial to determine one or more roots of the error locator polynomial, wherein the roots correspond to one or more error locations;
    prior to performing the Chien search, storing the error locator polynomial;
    determining whether a number of stored error locator polynomials is greater than a second threshold; and performing the Chien search on the error locator polynomial in the event the number of stored error locator polynomials is greater than the second threshold.

2. The method of claim 1, wherein the first threshold is based at least in part on an error correction capability (τ).

3. The method of claim 2, wherein the first threshold is further based at least in part on an erasure correction capability (f).

4. The method of claim 1 further comprising selecting the error locator polynomial from a plurality of candidate error locator polynomials.

5. The method of claim 4, wherein selecting is based at least in part on one or more reliability values.

6. The method of claim 5, wherein the one or more reliability values are output by a soft-output Viterbi decoder.

7. The method of claim 1 further comprising:
determining, after the Chien search is performed, whether the Chien search was successful; and
selecting a second error locator polynomial from a plurality of candidate error locator polynomials in the event the Chien search was not successful.

8. A method for processing data, comprising:
obtaining a length of an error locator polynomial;
determining, using a processor, whether the length of the error locator polynomial is greater than a threshold;
in the event the length of the error locator polynomial is greater than the threshold, skipping performance of a Chien search on the error locator polynomial;
in the event the length of the error locator polynomial is less than or equal to than the threshold, performing the Chien search on the error locator polynomial to determine one or more roots of the error locator polynomial, wherein the roots correspond to one or more error locations;
obtaining raw data and reliabilities corresponding to each bit in the raw data;
determining a plurality of flip patterns based at least in part on the raw data;
selecting and discarding one flip pattern from the plurality; and
redistributing one or more probabilities associated with the discarded flip pattern amongst one or more surviving flip patterns.

9. The method of claim 8, wherein redistributing is based at least in part on which surviving flip pattern is a nearest flip pattern in a Hamming distance sense.

10. A system for processing data, comprising:
an interface configured to:
obtain a length of an error locator polynomial; and
obtain raw data and reliabilities corresponding to each bit in the raw data and a processor configured to:
determine whether the length of the error locator polynomial is greater than a threshold;
in the event the length of the error locator polynomial is greater than the threshold, skip performance of a Chien search on the error locator polynomial;
in the event the length of the error locator polynomial is less than or equal to than the threshold, perform the Chien search on the error locator polynomial to determine one or more roots of the error locator polynomial, wherein the roots correspond to one or more error locations;
determine a plurality of flip patterns based at least in part on the raw data select and discard one flip pattern from the plurality; and
redistribute one or more probabilities associated with the discarded flip pattern amongst one or more surviving flip patterns.

11. The system of claim 10, wherein the threshold is based at least in part on an error correction capability (τ).

12. The system of claim 11, wherein the threshold is further based at least in part on an erasure correction capability (f).

13. The system of claim 10, wherein the processor is further configured to select the error locator polynomial from a plurality of candidate error locator polynomials.

14. The system of claim 13, wherein the processor is configured to select based at least in part on one or more reliability values.

15. The system of claim 14, wherein the one or more reliability values are output by a soft-output Viterbi decoder.

16. The system of claim 10, wherein the processor is further configured to:
determine, after the Chien search is performed, whether the Chien search was successful; and
select a second error locator polynomial from a plurality of candidate error locator polynomials in the event the Chien search was not successful.

17. The system of claim 10, wherein the processor is configured to redistribute based at least in part on which surviving flip pattern is a nearest flip pattern in a Hamming distance sense.

18. A system for processing data, comprising:
an interface configured to obtain a length of an error locator polynomial; and
a processor configured to:
determine whether the length of the error locator polynomial is greater than a threshold;
in the event the length of the error locator polynomial is greater than the threshold, skip performance of a Chien search on the error locator polynomial;
in the event the length of the error locator polynomial is less than or equal to than the threshold, perform the Chien search on the error locator polynomial to determine one or more roots of the error locator polynomial, wherein the roots correspond to one or more error locations;
prior to performing the Chien search, store the error locator polynomial;
determine whether a number of stored error locator polynomials is greater than a second threshold; and
perform the Chien search on the error locator polynomial in the event the number of stored error locator polynomials is greater than the second threshold.

19. A computer program product for processing data, the computer program product being embodied in a non-transitory computer readable storage medium and comprising computer instructions for:
obtaining a length of an error locator polynomial;
determining whether the length of the error locator polynomial is greater than a threshold;
in the event the length of the error locator polynomial is greater than the threshold, skipping performance of a Chien search on the error locator polynomial;
in the event the length of the error locator polynomial is less than or equal to than the threshold, performing the Chien search on the error locator polynomial to determine one or more roots of the error locator polynomial, wherein the roots correspond to one or more error locations;
prior to performing the Chien search, storing the error locator polynomial;
determining whether a number of stored error locator polynomials is greater than a second threshold; and
performing the Chien search on the error locator polynomial in the event the number of stored error locator polynomials is greater than the second threshold.

20. A computer program product for processing data, the computer program product being embodied in a non-transitory computer readable storage medium and comprising computer instructions for:
- obtaining a length of an error locator polynomial;
- determining whether the length of the error locator polynomial is greater than a threshold;
- in the event the length of the error locator polynomial is greater than the threshold, skipping performance of a Chien search on the error locator polynomial;
- in the event the length of the error locator polynomial is less than or equal to than the threshold, performing the Chien search on the error locator polynomial to determine one or more roots of the error locator polynomial, wherein the roots correspond to one or more error locations;
- obtaining raw data and reliabilities corresponding to each bit in the raw data;
- determining a plurality of flip patterns based at least in part on the raw data;
- selecting and discarding one flip pattern from the plurality; and
- redistributing one or more probabilities associated with the discarded flip pattern amongst one or more surviving flip patterns.

* * * * *